United States Patent [19]
De Jaeger et al.

[11] 4,425,420
[45] Jan. 10, 1984

[54] PRODUCTION OF A PLANOGRAPHIC PRINTING PLATE THROUGH THE SILVER COMPLEX DIFFUSION TRANSFER PROCESS

[75] Inventors: Antoine A. De Jaeger, Wilrijk; Gina C. De Lamper, Hoboken; Albert L. Poot, Kontich; Albert P. Wagemans, Edegem, all of Belgium

[73] Assignee: Agfa-Gevaert N.V., Mortsel, Belgium

[21] Appl. No.: 351,535

[22] Filed: Feb. 23, 1982

[30] Foreign Application Priority Data

Feb. 25, 1981 [GB] United Kingdom ............... 8105930

[51] Int. Cl.$^3$ .............................................. G03C 5/54
[52] U.S. Cl. ................................. 430/204; 430/231; 430/247
[58] Field of Search ...................... 430/204, 231, 247

[56] References Cited

U.S. PATENT DOCUMENTS

| | | | |
|---|---|---|---|
| 3,186,842 | 6/1965 | De Haes et al. | 430/204 |
| 3,300,306 | 1/1967 | Sevens et al. | 430/204 |
| 3,411,994 | 11/1968 | Wainer | 204/35 |
| 3,424,580 | 1/1969 | Wainer | 430/247 |
| 3,989,521 | 11/1976 | De Haes et al. | 430/204 |

FOREIGN PATENT DOCUMENTS 1330657 9/1973 United Kingdom ............... 430/204

Primary Examiner—Richard L. Schilling
Attorney, Agent, or Firm—William J. Daniel

[57] ABSTRACT

Process for the production of a planographic printing plate by means of the silver complex diffusion transfer reversal process comprising the steps of:
 image-wise photo-exposing a silver halide emulsion layer; developing the resultant latent image in the presence of a silver halide complexing agent and contacting the exposed silver halide emulsion layer with an anodized aluminium plate characterized in that the thickness of the anodized surface layer is in the range of 0.50 to 2.00 μm, the anodized plate before contact of the same with the emulsion has been hydration-sealed in the temperature range of 60°–80° C., and the development of the light-sensitive material is carried out with a developing composition having a pH of at least 12, and containing:
 dissolved sulphite,
 dissolved thiosulphate, and
 a mixture of hydroquinone and at least one secondary developing agent of the class of 1-phenyl-3-pyrazolidinones and p-N-methylaminophenol.

8 Claims, No Drawings

PRODUCTION OF A PLANOGRAPHIC PRINTING PLATE THROUGH THE SILVER COMPLEX DIFFUSION TRANSFER PROCESS

This invention relates to the production of a planographic printing plate through the silver complex diffusion transfer process.

Several embodiments of the application of the silver complex diffusion transfer reversal process (DTR-process) in the production of a planographic printing master have been described by Andre Rott and Edith Weyde in their book "Photographic Silver Halide Diffusion Processes"—Focal Press, London—New York (1972) 101–130.

In one important variant of that process an aluminium foil is used as a receptor material forming the printing master. A light-sensitive silver halide material which has been exposed imagewise is passed together with the aluminium foil through an office DTR-apparatus wherein the imagewise exposed material is developed and complexed silver halide is transferred to the aluminium foil to form thereon a silver image. By means of a short after-treatment the resulting bimetallic plate (aluminium foil carrying the imagewise deposited silver) is transformed in a planographic printing plate suited for offset printing by making the aluminium water-receptive and ink-repellent and the silver image ink-receptive and water-repellent.

According to this book the DTR-aluminium offset systems available on the market can be grouped into two classes:

(A) those in which the aluminium foil—whether or not it has been eloxated—has been provided with development nuclei; (and are thus based on the original DTR-principle), and (B) those in which the aluminium foil contains no nuclei but the aluminium itself takes part actively in the formation of the silver image by electrochemical reduction of the transferred silver complexes.

In commercial versions of the A type it has been considered indispensable to apply development nuclei for initiating the physical development of the transferred silver complexes. Indeed, although according to Example 1 of G.B. Pat. No. 830,623 an anodically treated aluminium plate without nuclei can yield a detectable silver image, the preliminary dipping of the plate into a solution containing developing nuclei e.g. colloidal silver sulphide was desirable to obtain a silver image of improved quality.

Anodizing processes for aluminium are well known. In U.S. Pat. No. 3,411,994 aluminium and aluminium base alloys are anodized in an electrolyte of 1% aqueous sulphuric acid and then treated in a 3% solution of oxalic acid in deionized water. After washing in hot water and drying, an aluminium plate thus treated is said to be an excellent receptor for diffusion transfer images as described in the concurrently filed U.S. Pat. No. 3,424,580. In the latter patent a special process for treating anodized aluminium and aluminium base alloy is described which makes it possible to obtain an excellent receptor for the formation of permanent non-erasable positive images on aluminium according to the DTR-process. The key to success in this process as claimed is the use of an aluminium surface free from any traces of sulphate.

According to U.S. Pat. No. 3,424,580, the presence of sulphate results in an image reposing on the plate surface instead of penetrating at least partly into the pores of the anodized surface. The inability to penetrate into the pores of the anodized aluminium surface is found to be exhibited no matter what the anodizing process is, even if only traces of sulphate ion are present. In order to remove any sulphate after carrying out the anodization in dilute sulphuric acid medium, the resulting anodized aluminium plate is treated with a solution containing oxalic acid. Preference is given to the use of an oxalic acid solution which contains at least one alkali metal double oxalate selected from the group consisting of alkali metal oxalates of titanium, zirconium and thallium or to the use of an aluminium base alloy containing a small amount of at least one alloy-element selected from the group consisting of gold, silver, platinum and palladium.

By the presence of said alloy-elements the anodized aluminium surface is self-nucleated. Where chemically pure aluminium is anodized, the anodized surface requires special treatment to act properly as nucleating surface for the diffusion transfer process.

It has further been described in U.S. Pat. No. 3,424,580 that if the aluminium contains in the range of 1 to 4 weight percent of the elements titanium, zirconium, niobium, tantalum, or thorium, oxalic acid-anodizing in accordance with standard practice but in the absence of alkali oxalates yields a porcelain-like finish after hot water sealing and after washing, and prior to sealing such a surface represents a good receptor for the diffusion transfer process.

In the above U.S. Pat. Nos. 3,411,994 and 3,424,580 the aluminium plates carrying a silver image are not used for planographic printing.

In system (B) for the formation of aluminium offset plates according to the DTR-process wherein no development nuclei are used and the aluminium itself takes actively part in the formation of the silver image, aluminium foils have to be used wherefrom the aluminium oxide layer is removed completely during processing (cfr. G.B. Pat. No. 946,538 and U.S. Pat. No. 3,186,842). Such processing calls for the use of strongly alkaline liquids, aluminium having a certain degree of purity (99–99.5% by weight of Al) and special measures to exclude free alkaline earth metal ions which always are present in tap water. According to G.B. Pat. No. 946,538 the transferred silver image has an improved adhesion to the aluminium support if the diffusion transfer process is carried out in the presence of cadmium and/or zinc salts.

The present invention provides a process for the formation of long-lasting strongly wear-resistant aluminium planographic printing plates according to the DTR-process in which an anodized aluminium plate is used as receptor material and in which there is no need for a separate, special nucleation treatment.

In accordance with the present invention the production of a long-lasting strongly wear-resistant planographic printing plate e.g. foil proceeds according to the silver complex diffusion transfer reversal process, comprising the steps of:

(1) providing a light-sensitive silver halide material containing a silver halide emulsion layer with a silver halide coverage equivalent to at least 1 g of silver nitrate per sq.m;

(2) image-wise photo-exposing said silver halide emulsion layer;

(3) developing the resultant latent image in the presence of a silver halide complexing agent and contacting the exposed silver halide emulsion material with an anodized aluminium plate, to thereby transfer image-wise complexed silver halide onto said plate surface and develop thereon a silver image, and (4) separating the silver halide material from the aluminium plate, characterized in that the thickness of the anodized surface layer is in the range of 0.50 to 2.00 μm, the anodized plate has been hydration sealed at a temperature of at least 60° C. and not higher than 85° C., the hydration-sealing being up to a degree that less than half the amount of dye is adsorbed of the amount that is adsorbed before the sealing, as measured by the "dry immersion test" described below and corresponding to DIN 50946 of June 1968, and the development of the light-sensitive material is carried out with a developing composition having a pH of at least 12, and containing:

dissolved sulphite expressed equivalent to sodium sulphite in the range of 80–160 g/liter, dissolved thiosulphate expressed equivalent to sodium thiosulphate in the range of 2–20 g/liter, and a mixture of hydroquinone and at least one secondary developing agent of the class of 1-phenyl-3-pyrazolidinones and p-N-methyl-aminophenol wherein, the amount of hydroquinone is not smaller than 0.078 mole per liter, the amount of secondary developing agent(s) is not smaller than 0.0080 mole per liter and the molar ratio of hydroquinone to said secondary developing agent(s) being not smaller than 9.7.

Dye Immersion Test: For measuring the sealing degree a flat material cut of 5 cm × 12 cm is dipped half in a solution of 0.5 g of aluminium blue (Solway Blue BN 150 of I.C.I.) in 1 L of distilled water of 40°–45° C. for 20 min, rinsed with distilled water and dried. The degree of staining is a measure of the degree of sealing.

Preferred amounts of hydroquinone are in the range of 0.15 mole to 0.20 mole per liter and preferred amounts of secondary developing agent(s) in the range of 0.015 to 0.020 mole per liter. Preferred amounts of sulphite are in the range of 120 g to 150 g per liter and preferred amounts of thiosulphate in the range of 5 g to 15 g per liter.

Optimal results with respect to adherence of the silver image and its receptivity of oleophilic ink are obtained with a developing composition containing per liter 120 g of sodium sulphite, 7.0 g of sodium thiosulphate and a mixture of 20 g (0.18 mole) of hydroquinone and 3 g (0.018 mole) of 1-phenyl-3-pyrazolidinone, the pH of this composition being 13.10.

Particularly useful substitutes of 1-phenyl-3-pyrazolidinone are 1-phenyl-4-monomethyl-3-pyrazolidinone and 1-phenyl-4,4-dimethyl-3-pyrazolidinone.

Sealing of the an aluminium oxide layer obtained by anodization is a technique known to those skilled in the art of anodizing and is described e.g. in the "Belgisch-Nederlands tijdschrift voor Oppervlaktetechnieken van materialen", 24e jaargang/januari 1980 under the title "Sealing-kwaliteit en sealing-controle van geanodiseerd Aluminium". In sealing of the porous anodized aluminium two types of sealing are distinguished, (1) sealing with a wax or a lacquer and (2) hydration-sealing by which is meant that the pores are closed or partly closed by water-acceptance in the formation of hydrated needle-like aluminium oxide crystals (böhmite).

The aluminium used as the base sheet may be pure Al as well as an aluminium alloy whose aluminium content is at least 95%.

A useful alloy has, e.g., the following composition, the percentages being by weight: Al 99.55%; Fe: 0.29%; Si: 0.10%; Cu: 0.004%; Mn: 0.002%; Ti: 0.02%, and Zn: 0.03%.

The anodization of the aluminium proceeds preferably in dilute aqueous sulphuric acid medium (less than 2% by weight of sulphuric acid) till the indicated thickness of the surface layer is obtained. The aluminium plate may be anodized at both sides.

The thickness of the anodized surface layer is most accurately measured by making a micrographic cut but may be determined likewise by dissolving the layer and weighing the plate before dissolution treatment and subsequent thereto. Optimal results are obtained with a surface layer thickness of 1.00 μm.

The useful results of the present process are not dependent on the absence of any traces of sulphate in the plate. Thus it has been found experimentally that aluminium plates anodized in sulphuric acid medium and sealed to the degree as defined do not yield inferior results with regard to silver image adherence and ink-receptivity.

No treatment with oxalic acid is thus necessary to remove residual sulphate ions. The plate is simply rinsed with water and the surface layer is hydration-sealed at at least 60° C., but at a temperature not higher than 85° C. preferably in the temperature range of 60° to 80° C., using e.g. pure water or steam. The hydration-sealing may be up to a degree that substantially less than half the amount of dye is adsorbed of the amount that is adsorbed before the sealing, the test on sealing proceeding according to said DIN No. 50946 of June 1968. The less dye is adsorbed the better is the sealing. Sealing may go on further on storage.

The plate may be brushed in dry state before use.

As silver halide emulsion material suitable for use in the present process any photosensitive silver halide material with the described minimum coverage of silver halide can be used. The photosensitive material may contain a negative or direct-positive working silver halide emulsion layer that will give a sufficiently rapid development and formation of a complex of non-developed silver halide with the defined developing composition. In view of those requirements and in order to obtain a satisfactory gradation necessary for graphic purposes, in practice a mainly silver chloride emulsion is used, which furthermore may contain minor amounts of silver bromide and/or iodide or other ingredients e.g. chemical and spectral sensitizers, stabilizers, antifogging agents, developers and/or development accelerators, wetting agents and light-screening substances necessary for obtaining desired emulsion characteristics. The emulsion may contain emulsion stabilizing amounts of cadmium salts, these amounts not being in the order of the amounts used in the system (B) referred to hereinbefore. More details about the composition, preparation and coating of silver halide emulsions may be found e.g. in Product Licensing Index, Vol. 92, December 1971, publication 9232, p. 107–109. The silver halide emulsion layer may be hardened to prevent the transfer of a substantial amount of gelatin to the aluminium surface layer. Alternatively, very good results with respect to silver image adherence are obtained by coating the silver halide emulsion layer with a water-permeable non-gelatinous colloid outer layer e.g. of colloidal carbohydrates such as carboxymethylcellulose or a starch ether such as SOLVITOSE (registered trade name as Sichel-Werke, W-Germany) at a coverage in the range of 0.1 to 0.01 g per sq.m.

Contrary to the Type B aluminium offset system referred to above there is not special need in the invention to carry out the diffusion transfer process as described in G.B. Pat. No. 946,538 in the presence of cadmium or zinc ions which are environment-polluting when introduced into waste water. So, in the present process neither the silver halide emulsion material nor the processing liquids have to contain such ions, which is in favour of ecologically clean operation.

The support for the photographic material used in the invention may be any material as long as it does not affect the photographic properties and is dimensionally stable. Typical flexible sheet materials are paper supports, e.g. coated at one or both sides with an α-olefin polymer, e.g. polyethylene, or include cellulose nitrate film, cellulose acetate film, poly(vinyl acetal) film, polystyrene film, poly(ethylene terephthalate) film, polycarbonate film, poly-α-olefins such as polyethylene and polypropylene film, and related films or resinous materials. The support may be provided with an anti-reflection layer usually containing carbon black to improve the image sharpness.

The carbon black containing layer may be replaced by a metal oxide e.g. titanium dioxide or zinc oxide containing light reflecting layer to obtain good exposure latitude and images sharpness without losing photographic speed. The use of such a metal oxide layer between a transparent or translucent support and the silver halide emulsion layer is particularly interesting in reflectographic contact exposure wherein the combination of the support and metal oxide containing layer is still sufficiently light-transmitting to allow light from the light source of the exposure apparatus to pass through and to reach via the silver halide emulsion layer the contacting original from which the light is image-wise reflected and reaches the silver halide emulsion layer and reflecting layer again. The reflectographic contact exposure is suited for fast reproduction of any kind of originals representing line or screen work. Titanium dioxide is the preferred pigment for the light reflecting layer. The pigment may be modified to counteract staining after processing as is described in U.S. Pat. No. 3,928,037.

Good results are obtained with light reflecting layers containing titanium dioxide in the range of 2 to 35 g per sq.m and sufficient hydrophilic binder e.g. gelatin.

The support is e.g. a translucent paper support e.g. polyethylene coated paper support in which the polyethylene layer may contain already a certain amount of titanium dioxide. The optical density of such support may be e.g. 0.6 to 0.7 and the light-reflecting layer preferably contains in that case from 15 to 25 g per sq.m of titanium dioxide.

For the exposure of the silver halide emulsion material manufacturers provide a wide choice of cameras: horizontal, vertical and darkroom type cameras and contact-exposure apparatus to suit each particular class of reprographic work.

The development and diffusion transfer may proceed in an automatically operated apparatus e.g. ESKOFOT 339. They are normally carried out at a temperature in the range of 18° C. to 30° C.

After formation of the silver image on the aluminium plate, the surface thereof is subjected as is common practice in the art to a chemical treatment which increases the hydrophility of the non-silver image parts and the oleophility of the silver image.

According to a preferred embodiment, such chemical after-treatment is carried out with a lithographic preparation containing at least one compound enhancing the ink and/or lacquer receptivity of the silver image, and containing further at least one compound increasing the ink-repelling characteristics of the plate metal.

Suitable ingredients for such lithographic preparation (usually also called fixer) are described in the already mentioned book "Photographic Silver Halide Diffusion Processes" pages 105–107.

Compounds improving the ink affinity of the silver image belong, e.g., to the class of organic compounds containing a mercapto group e.g. dodecylmercaptan and 1-phenyl-1 H-tetrazole-5-thione. Compounds improving the oleophilic ink-repellency of the bare anodized aluminium plate areas are, e.g., carbohydrates e.g. acid polysaccharides such as gum arabic, and further sorbitol and phosphoric acid.

According to a preferred embodiment for the production of long-run printing plates a second after-treatment is applied to deposit a lacquer on the silver image areas. For this purpose, lacquers based on phenol- or cresol-formaldehyde alkyd and/or epoxyresins resins are generally used.

Another useful resin for such a lacquer is a mixture of homopolymers and copolymers of styrene, ortho-, meta-, or para-vinyltoluene and indene units. Cyclohexanone can be used as solvent and linseed oil as plasticizer. Examples of suitable lacquer composition are described e.g. in G.B. Pat. No. 968,706 and 1,071,163 and in CA-P 686,284.

A lithographic composition wherein the fixer and lacquer are combined is described, e.g., in G.B. Pat. No. 969,072.

The following examples illustrate the present invention, without however limiting it thereto. All ratios and percentages are by weight unless otherwise indicated.

EXAMPLE 1

In the preparation of planographic printing plates several anodized and sealed aluminium plates as described hereinafter in the Table I were used in conjunction with a light-sensitive negative working silver halide emulsion sheet material suitable for exposure in a process-camera. The light-sensitive material contained a cadmium-free silver chloride bromide (1 mole % bromide) emulsion layer, the silver halide being coated in an amount corresponding with 1.5 g of silver nitrate per sq.m.

After exposure with a contact screen the light-sensitive sheet was wetted with the following developing solution in a conventional diffusion transfer apparatus and contacted for 30 s with the anodized aluminium plate at 20° C. and thereupon separated to leave a positive silver image on the aluminium plate.

| Developing solution | |
|---|---|
| carboxymethylcellulose | 9 g |
| sodium hydroxide | 20 g |
| sodium sulphite | 120 g |
| hydroquinone | 20 g |
| 1-phenyl-3-pyrazolidinone | 3 g |
| potassium bromide | 0.75 g |
| sodium thiosulphate | 7.5 g |
| benzyl trimethylammonium hydroxide | 7.9 g |

-continued

| Developing solution | |
|---|---|
| water up to | 1000 ml |

Each plate with a positive silver image was treated with a lithographic preparation having the following composition:

| carboxymethylcellulose | 3.24 g |
|---|---|
| sodium phosphate | 0.6 g |
| phosphoric acid | 0.3 g |
| cetyl trimethyl ammonium bromide | 0.06 g |
| aqueous solution of formaldehyde 20% | 1 g |
| water up to | 1000 ml | and thereupon rubbed with a cotton swab soaked with a lacquer described in Example 1 of G.B. Pat. No. 968,706.

Then the plates were used for printing on an offset printing press.

TABLE 1

| Thickness of the anodized layer | 0.5 μm | | 1 μm | | 1.5 μm | | 2.0 μm | |
|---|---|---|---|---|---|---|---|---|
| Sealing temperature (°C.) | 60 | 80 | 60 | 80 | 60 | 80 | 60 | 80 |
| Properties of the printing form | | | | | | | | |
| ink acceptance | fg | g | g | vg | g | g | fg | g |
| image quality | fg | g | g | vg | g | g | fg | g |
| number of runs at indicated image quality | fh | fh | h | vh | h | h | fh | fh | vg: very good
g: good
fg: fairly good
vh: more than 50,000
h: more than 20,000
fh: less than 5,000.

The replacement of the above developing solution by the developing solution of Example 1 of G.B. Pat. No. 830,623 yielded only a poor ink-acceptance and only a low number of prints of inferior image quality.

EXAMPLE 2

In the preparation of a planographic printing plate the light-sensitive silver halide material described in Example 1 was used in combination with an anodized and sealed aluminium plate having an anodized and sealed layer of 1 μm (sealed at 85° C.). For comparative purposes the diffusion transfer processing proceeded in different developer solutions derived from the solution of Example 1 but containing different amounts of developing agents and complexing agents as listed in Table II hereinafter, the amounts being expressed in g per liter.

TABLE II

| | I | II | III | IV | V | VI |
|---|---|---|---|---|---|---|
| hydroquine | 10 | 20 | 30 | 20 | 20 | 20 |
| 1-phenyl-3-pyrazolidinone | 1.5 | 3 | 4.5 | 3 | 3 | 3 |
| sodium thiosulphate | 7 | 3.5 | 7 | 3.5 | 7 | 10.5 |

After treatment with fixer and lacquer as described in Example 1 the differently developed plates were used as printing plate on an Adressograph Mutligraph Offset printing machine type 1250 to make printing runs of 50,000.

The best results in screen dot rendering were obtained with the development combination V which proved to be the best also in resistance to exhaustion.

EXAMPLE 3

In the preparation of a planographic printing plate, an anodized and sealed aluminium plate as described in Example 2 was used but before diffusion transfer processing the plate was brushed in the dry state to roughen its sealed surface. The light-sensitive material used in the processing was a contact-exposed negative working silver halide emulsion material manufactured by Agfa-Gevaert N.V. Belgium, and containing a cadmium-free silver chloride emulsion layer with a silver chloride coverage equivalent to 1.5 g of silver nitrate per sq.m. The obtained printing plate was only treated with the lithographic preparation described in Example 1 and did not need a lacquer treatment in order to produce in offset-printing at least 10,000 prints of good quality.

We claim:

1. In a process for producing a planographic printing plate by the silver complex diffusion transfer reversal process comprising the steps of:
   (1) providing a light-sensitive silver halide material containing a silver halide emulsion layer with a silver halide coverage equivalent to at least 1 g of silver nitrate per sq.m;
   (2) image-wise photo-exposing said silver halide emulsion layer;
   (3) developing the resultant latent image in the presence of a silver halide complexing agent and contacting the exposed silver halide emulsion material with an anodized aluminium plate to thereby transfer image-wise complexed silver halide onto said plate surface and form thereon a silver image, and
   (4) separating the silver halide material from the aluminium plate; the improvement wherein the thickness of the anodized surface layer is in the range of 0.50 to 2.00 μm, the anodized plate before coming into contact with said emulsion layer is hydration-sealed at a temperature of at least 60° C. but not higher than 85° C., to a degree reducing to less than one half the amount of dye adsorbed thereby in the dye immersion test described in the specification compared to an unsealed anodized plate, and the development of the light-sensitive material is carried out with a developing composition having a pH of at least 12 and containing:
   dissolved sulphite expressed equivalent to sodium sulphite in the range of 80–160 g/liter,
   dissolved thiosulphate expressed equivalent to sodium thiosulphate in the range of 2–20 g/liter, and
   a mixture of hydroquinone and at least one secondary developing agent of the class of 1-phenyl-3-pyrazolidinones and p-N-methylaminophenol, the amount of hydroquinone being not smaller than 0.078 mole per liter, the amount of all such secondary developing agents being not smaller than 0.0080 mole per liter and the molar ratio of hydroquinone to such secondary developing agents being not smaller than 9.7.

2. Process according to claim 1, characterized in that the developing composition contains hydroquinone in the range of 0.15 mole to 0.20 mole per liter, secondary developing agent(s) in the range of 0.015 to 0.020 mole per liter, said sulphite in an amount of 120 to 150 g per liter, and said thiosulphate in the range of 5 g to 15 g per liter.

3. Process according to claim 1, characterized in that the developing composition contains per liter 120 g of sodium sulphite, 7.0 g of sodium thiosulphate and a mixture of 20 g of hydroquinone and 3 g of 1-phenyl-3-pyrazolidinone.

4. Process according to claim 1, characterized in that the anodization of the plate has been carried out in dilute aqueous sulphuric acid medium of a concentration up to 2% by weight.

5. Process according to claim 1, characterized in that the surface layer obtained by anodization is hydration-sealed in a temperature range of 60°–80° C.

6. Process according to claim 1, characterized in that the silver halide material is free from cadmium ions.

7. Process according to claim 1, characterized in that the silver halide material has a silver halide emulsion layer containing mainly silver chloride.

8. Process according to claim 1, characterized in that the silver halide emulsion layer is coated with a water-permeable non-gelatinous outer layer at a coverage of 0.1 to 0.01 g per sq.m.

* * * * *